United States Patent
Jia et al.

(10) Patent No.: US 10,388,709 B2
(45) Date of Patent: Aug. 20, 2019

(54) PIXEL DEFINING LAYER AND PRODUCTION METHOD THEREOF, DISPLAY PANEL AND PRODUCTION METHOD THEREOF, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Wenbin Jia, Beijing (CN); HuiFeng Wang, Beijing (CN); Xiang Wan, Beijing (CN); Changjun Jiang, Beijing (CN); Li Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/987,212

(22) Filed: May 23, 2018

(65) Prior Publication Data
US 2019/0148468 A1    May 16, 2019

(30) Foreign Application Priority Data

Nov. 14, 2017    (CN) .......................... 2017 1 1124152

(51) Int. Cl.
H01L 51/56    (2006.01)
H01L 27/32    (2006.01)
H01L 51/00    (2006.01)
H01L 51/50    (2006.01)

(52) U.S. Cl.
CPC ...... *H01L 27/3246* (2013.01); *H01L 27/3283* (2013.01); *H01L 51/0005* (2013.01); *H01L 51/56* (2013.01); *H01L 51/5012* (2013.01); *H01L 2227/323* (2013.01); *H01L 2251/558* (2013.01)

(58) Field of Classification Search
CPC ............................ H01L 51/0002; H01L 51/56
See application file for complete search history.

(56) References Cited

U.S. PATENT DOCUMENTS 9,268,169 B2    2/2016  Jiang
2015/0028310 A1*    1/2015  Dai ...................... H01L 27/3246
                                                                257/40
2015/0303393 A1*    10/2015  Dai ....................... H01L 51/004
                                                                257/40

FOREIGN PATENT DOCUMENTS

CN    102969333 A    3/2013
CN    107331681 A    11/2017

OTHER PUBLICATIONS

First Chinese Office Action dated Mar. 25, 2019, received for corresponding Chinese Application No. 201711124152.2.

* cited by examiner

*Primary Examiner* — Thomas L Dickey
(74) *Attorney, Agent, or Firm* — Kinney & Lange, P.A.

(57) ABSTRACT

A pixel defining layer and a production method thereof, a display panel and a production method thereof, and a display apparatus are all provided. The pixel defining layer has a first lyophilic layer, a first lyophobic layer on the first lyophilic layer, a second lyophilic layer on the first lyophobic layer, and a second lyophobic layer on the second lyophilic layer.

9 Claims, 8 Drawing Sheets

PIXEL DEFINING LAYER AND PRODUCTION METHOD THEREOF, DISPLAY PANEL AND PRODUCTION METHOD THEREOF, AND DISPLAY APPARATUS

CROSS-REFERENCE TO RELATED APPLICATION

This disclosure claims the priority of Chinese Patent Application No. 201711124152.2 filed on Nov. 14, 2017, which is incorporated herein in its entirety by reference.

BACKGROUND

This disclosure relates generally to the technical field of displays, and more to a pixel defining layer and a production method thereof, a display panel and a production method thereof, and a display apparatus.

Currently, pixels in an organic electroluminescent display (OLED) may be formed by means of ink jet printing. Typically, a pixel defining layer must be prepared on a substrate, to define the zones where the respective pixels are located, and then lighting-emitting layers are produced in specific opening regions of corresponding pixels by an ink jet printing process.

There exists a need for a pixel defining layer suitable for ink jet printing.

SUMMARY

In one aspect the present disclosure is directed to a pixel defining layer comprising a first lyophilic layer, a first lyophobic layer on the first lyophilic layer, a second lyophilic layer on the first lyophobic layer; and a second lyophobic layer on the second lyophilic layer.

Optionally, the first lyophobic layer and the first lyophilic layer can be obtained by subjecting an upper surface of a first lyophilic precursor layer to a lyophobization treatment.

Optionally, the second lyophobic layer and the second lyophilic layer can be obtained by subjecting an upper surface of a second lyophilic precursor layer to a lyophobization treatment.

Optionally, the first lyophobic layer can have a thickness of 20 nm or more.

Optionally, the second lyophilic layer and the second lyophobic layer can have a total thickness of between 850 and 1250 nm.

In a further embodiment, the present disclosure is directed to a display panel comprising a base substrate with the above-mentioned pixel defining layer situated on the base substrate, wherein the pixel defining layer defines a pixel zone.

Optionally, the display panel further can comprise a light-emitting layer in the pixel zone, wherein the top surface of the first lyophobic layer is higher than the top surface of the light-emitting layer.

Optionally, the top surface of the first lyophobic layer can be higher than the top surface of the light-emitting layer by at least 50 nm.

In still a further embodiment, the present disclosure is directed to a production method for the above-mentioned pixel defining layer, the method comprising forming the first lyophilic layer and the first lyophobic layer thereon, and forming the second lyophilic layer and the second lyophobic layer thereon on the first lyophobic layer, to form the pixel defining layer.

Optionally, forming the first lyophilic layer and the first lyophobic layer thereon can comprise forming a first lyophilic precursor layer, and subjecting the top surface of the first lyophilic precursor layer to a lyophobization treatment, to form the first lyophilic layer and the first lyophobic layer thereon.

Optionally, the first lyophilic precursor layer can comprise a fluororesin, and the lyophobization treatment can includes an exposure treatment and/or soft-baking.

Optionally, forming the second lyophilic layer and the second lyophobic layer thereon on the first lyophobic layer can comprise forming a second lyophilic precursor layer on the first lyophobic layer, and subjecting the top surface of the second lyophilic precursor layer to a lyophobization treatment, to form the second lyophilic layer and the second lyophobic layer thereon.

Optionally, the second lyophilic precursor layer can comprise a fluororesin, and the lyophobization treatment can include an exposure treatment and/or soft-baking.

Optionally, before forming the second lyophilic layer and the second lyophobic layer thereon, the production method can further comprise performing a surface treatment by introducing hexamethyldisilazane to the top surface of the first lyophobic layer, to impart hydrophobicity to the top surface of the first lyophobic layer.

Optionally, the first lyophilic layer and the first lyophobic layer thereon can be formed by a single patterning process, and the second lyophilic layer and the second lyophobic layer thereon formed by a single patterning process, wherein the single patterning processes comprise an exposure treatment and soft-baking.

In still a further embodiment, the present disclosure is directed to a production method for a display panel, the method comprising forming a pixel defining layer that defines a pixel zone, by the above-mentioned production method, and spray coating an ink containing a light-emitting layer material in the pixel zone by an ink jet printing process, wherein the ink forms a light-emitting layer in the pixel zone after a drying process.

In still a further embodiment, the present disclosure is directed to a display apparatus comprising the above-mentioned display panel.

DETAILED DESCRIPTION

This disclosure will be further described in details by incorporating drawings, in order to make the purposes, the technical solutions, and the advantages of this disclosure clearer. The embodiments described in detail herein are illustrative examples, and do not constitute the only embodiments contemplated with respect to the present disclosure.

The shapes and sizes of the components in the drawing do not reflect the actual scales. The purpose of the drawings is merely to illustrate the contents of this disclosure.

In the description below, the cases in which the pixel electrode (e.g. an ITO pixel electrode) is an anode are used for illustration. However, this disclosure is not limited thereto. The pixel electrode may also be a cathode.

Figure 1:
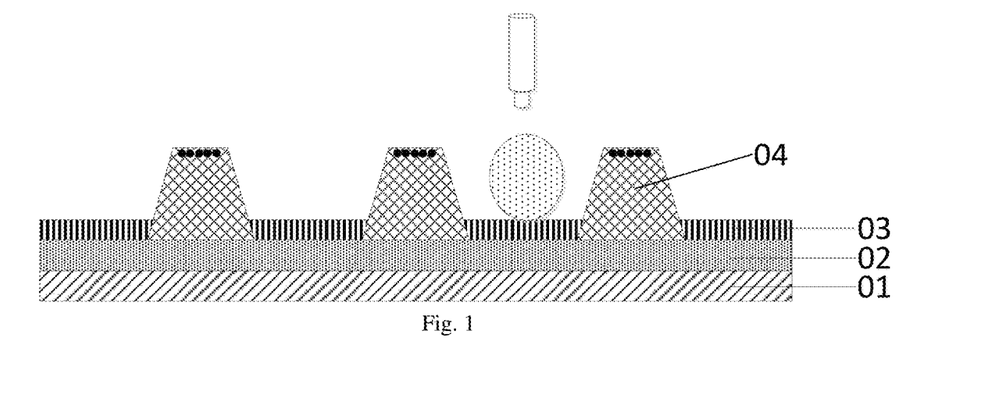
FIG. 1 is a schematic drawing of a structure of a pixel defining layer in the related art.

A display panel in the related art, as shown in FIG. 1, comprises a base substrate 01, a buffer layer 02 on the base substrate 01, a plurality of anodes 03 arranged in a matrix on the buffer layer 02, and a pixel defining layer 04 located between respective anodes 03. Typically, during preparation of the light-emitting layer by using an ink jet printing process, a pixel defining layer 04 is needed to be prepared on the base substrate 01 to define the zones where various sub-pixels are located, so that an ink droplet flows into the predetermined sub-pixel zone precisely. It should be noted that in this disclosure, the term "pixel" is generally used to refer to a single pixel, i.e. a sub-pixel. In order to allow the ink droplet spreading in the ITO pixel while not overflowing, a bifunctional material, in which the top has lower surface energy and the bottom has higher surface energy, is used for the pixel defining layer 04. The low surface energy at the top of the pixel defining layer 04 may impart lyophobicity to the surface layer, so as to ensure that the ink droplet cannot overflow. The high surface energy at the bottom of the pixel defining layer 04 may impart some lyophilicity to the bottom layer, so as to ensure the droplet to spread fully in the ITO pixel, for avoiding the current leakage phenomenon at pinhole generated due to that the droplet does not spread fully in the ITO pixel. In this disclosure, it should be understood that the terms "lyophilic" and "lyophilic" are used with respect to the droplet.

Figure 2:
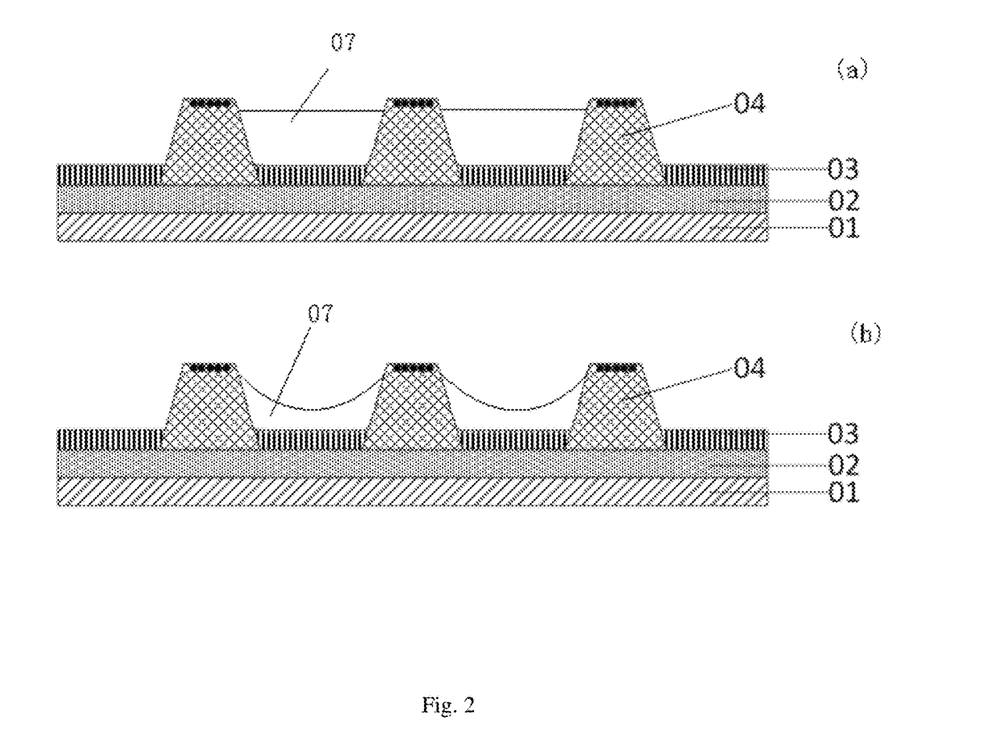
FIG. 2 is a schematic drawing of a drying process of an ink in the related art.
Figure 3:
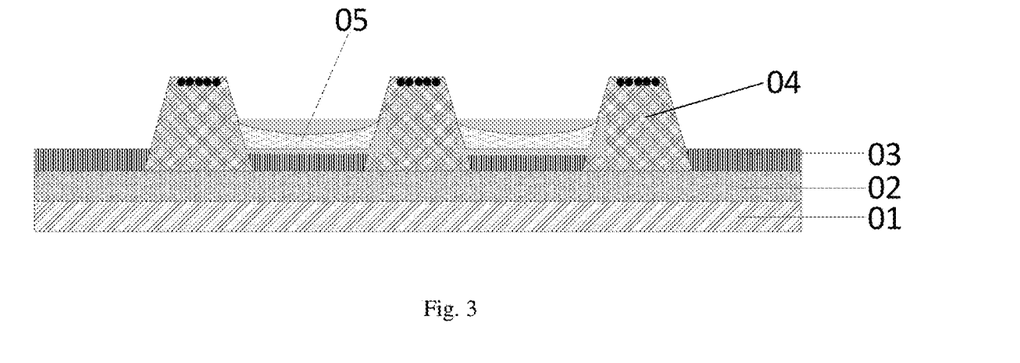
FIG. 3 is a schematic drawing of a structure of a display panel in the related art.

Current materials only provide pixel defining layer 04 with lyophobicity at the top surface in a very thin layer, while the material in a majority of the thickness at the bottom of the pixel defining layer 04 has lyophilicity. Thus, as shown in FIG. 2(a), after the ink jet printing, the ink 07 fills the ink-containing space defined by the pixel defining layer. As the solvent in the ink droplet is continuously vaporized, the ink droplet gradually dries and the level of the liquid sinks. However, since most of the inner wall of the pixel defining layer is lyophilic, the ink 07 will wet the inner wall of the pixel defining layer, so that the liquid level at the center sinks more. As shown in FIG. 2(b), during drying, the ink droplet would climb to the lyophobic layer along the lyophilic layer of the pixel defining layer 04, or in other words, would remain on the side wall of the pixel defining layer. As shown in FIG. 3, the light-emitting layer 05 formed after drying is an uneven thin film having a thicker edge and a thinner center. Such an uneven thin film tends to cause the device to emit light unevenly, and further to affect the life time of the device.

In the related art, in a pixel defining layer, the inner wall of the main part of the pixel defining layer has lyophilicity, except that the inner wall in a certain range of thickness near the top surface has lyophobicity. It would result in that the ink droplet will wet the inner wall of lyophilic material during drying in the ink jet printing, which equals that the droplet climbs towards the top surface of the pixel defining layer. The larger the distance between the top surface of the pixel defining layer and the base substrate is, the higher the droplet climbs. The light-emitting layer material formed after the ink droplet climbing on the inner wall of the pixel defining layer is dried would also participate in luminescence. As compared to the light-emitting layer at the center bottom of the pixel, the light-emitting layer material near the inner wall is much higher. Therefore, it tends to result in the problem of uneven display of the display panel. In the related art, the climbing phenomenon of the ink droplet may be effectively inhibited by reducing the thickness of the pixel defining layer. However, the thinner pixel defining layer would result in that the amount of ink droplet contained in the pixel decreases. This will also affect the display effect. If the height of the pixel defining layer remains, while all of the upper half part of the pixel defining layer has lyophilicity, the height of the ink droplet near the inner wall after drying may be suppressed. However, the uniform spreading of the ink droplet in the ink-containing space before drying would be affected. Further, producing such a structure is also hard.

Hence, a technical problem to be solved urgently is how to achieve even spreading of the ink droplet in the pixel zone while the amount of the ink droplet volume in the pixel is ensured, to improve the uniformity of the film thickness of the light-emitting layer formed after the ink is dried. An example of this disclosure provides a pixel defining layer, a display panel and production method thereof, to solve the technical problem in the display panel in the related art that the display effect is affected by the uneven film thickness of the light-emitting layer formed due to that the ink droplet is dried after climbing.

Figure 4:
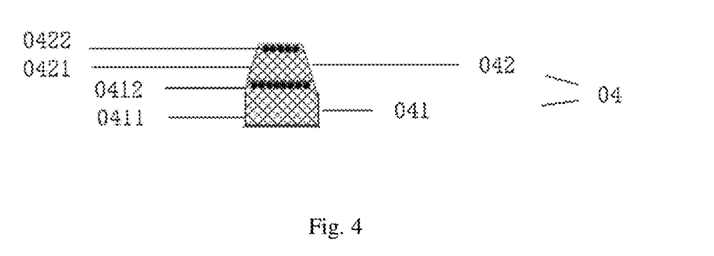
FIG. 4 is a schematic drawing of a structure of a pixel defining layer provided in an example of this disclosure.

On the basis of above, in order to solve at least partially the above-mentioned problem in the related art, an example of this disclosure provides a pixel defining layer. As shown in FIG. 4, the pixel defining layer 04 may be regarded as including two sub-layers, i.e. a first sub-layer 041 and a second sub-layer 042, wherein the top surface of the first sub-layer and the top surface of the second sub-layer have lyophobicity. In other words, the pixel defining layer comprises a first lyophilic layer 0411; a first lyophobic layer 0412 on the first lyophilic layer; a second lyophilic layer 0421 on the first lyophobic layer; and a second lyophobic layer 0422 on the second lyophilic layer. In the description below, sometimes, the first sub-layer is used to refer to the first lyophilic layer and the first lyophobic layer thereon, and the second sub-layer is used to refer to the second lyophilic layer and the second lyophobic layer thereon.

It should be noted that the shapes of the two sub-layers in the drawings are illustrative, but not limiting. The two sub-layers may be of any shape, as long as the pixel defining layer constituted has an available shape for a pixel defining layer in the art.

It should also be noted that since the effects of the first lyophilic layer and the first lyophobic layer to the ink merely occur on the inner wall thereof, it is all right that the lyophilicity and lyophobicity of the inner wall comply with the layer structure mentioned above.

Additionally, in this disclosure, there may be not any very ambiguous borderline between the first lyophilic layer and the first lyophobic layer, in particular in the case that the both are obtained by treating a first lyophilic precursor layer (precursor lyophilic layer). In this case, since the first lyophilic layer and the first lyophobic layer may be formed due to that the components of the first lyophilic precursor layer are redistributed (e.g. enrichment of fluorine) after exposure and baking, there may be a transition zone between the two layers, where the lyophobicity is between those of the two layers.

Figure 5:
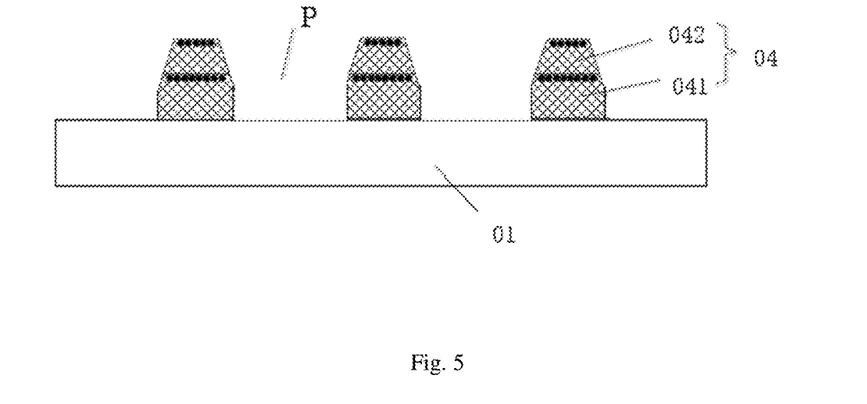
FIG. 5 is a schematic drawing of a structure of a display panel provided in an example of this disclosure.

An embodiment of a display panel comprising the pixel defining layer is shown in FIG. 5. The display panel comprises a base substrate 01 and a pixel defining layer 04 on the base substrate, wherein the pixel defining layer comprises a first sub-layer 041 and a second sub-layer 042 on the first sub-layer. The top surface of the first sub-layer and the top surface of the second sub-layer both have lyophobicity. Specifically, the panel may comprise a first lyophilic layer, a first lyophobic layer, a second lyophilic layer and a second lyophobic layer. A pixel zone P is situated between the walls of the pixel defining layer 04. The panel can also include other necessary components, such as electrodes, circuits, various functional layers, etc.

Figure 6:
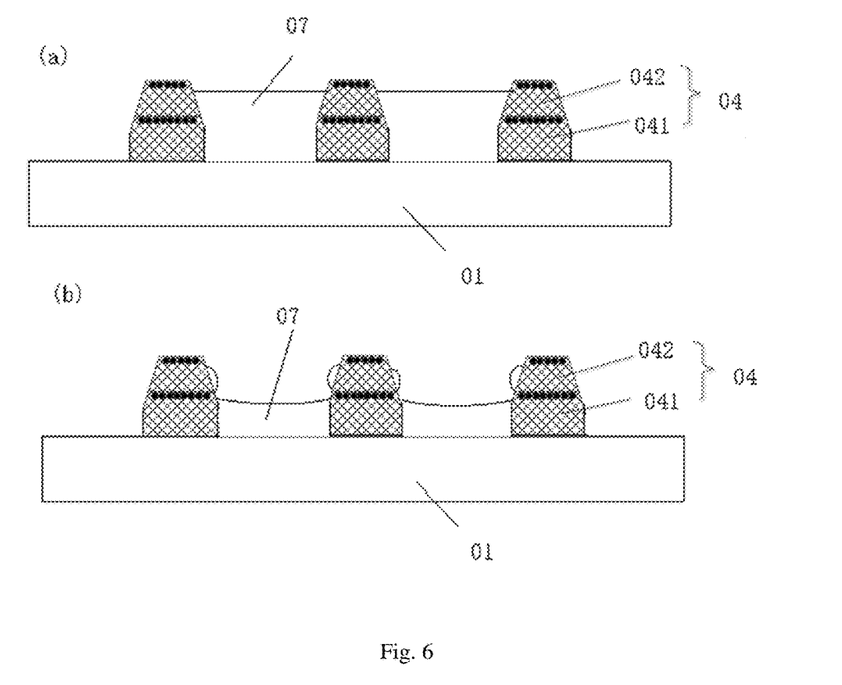
FIG. 6 is a schematic drawing of a drying process of an ink in an example of this disclosure.

FIG. 6 shows the state of the ink after the ink jet printing in the display panel in the embodiment shown in FIG. 5. As shown in FIG. 6(a), after the ink jet printing, ink 07 fills the ink-containing space defined by the pixel defining layer. As the solvent in the ink droplet is continuously vaporized, the ink droplet gradually dries, and the level of the liquid sinks. Since the first lyophobic layer is present, the ink droplet cannot continuously spread on the inner wall of the pixel defining layer. As shown in FIG. 6(b), the rise of the edge of the ink droplet is limited by the first lyophobic layer. The edge of the ink droplet is substantially at the same level as the liquid level at the center. A little ink will remain on the inner wall of the second lyophilic layer. However, the light-emitting material formed after it is dried is separated physically from the light-emitting layer below, and thus would not participate in luminescence and thereby would not affect the uniformity of luminescence.

Figure 7:
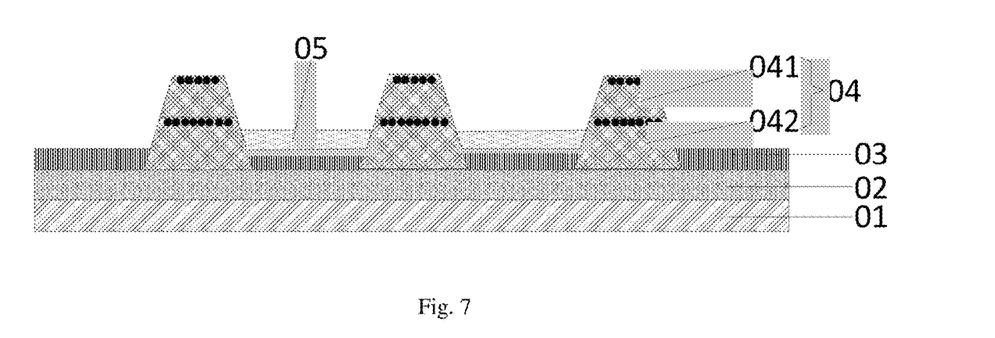
FIG. 7 is a schematic drawing of a structure of a display panel provided in another example of this disclosure.

Another embodiment of the display panel is shown in FIG. 7. It comprises a base substrate 01, a plurality of anodes 03 arranged in a matrix on the base substrate 01, and a pixel defining layer 04 located between respective anodes 03. It further comprises a buffer layer 02 between the base substrate 01 and the pixel defining layer 04. The pixel defining layer 04 comprises a first sub-layer 041 located at the side towards the base substrate 01 and a second sub-layer 042 located at the side of the sub-layer 041 away from the base substrate 01, wherein the top surface of the first sub-layer 041 and the top surface of the second sub-layer 042 have lyophobicity. The first sub-layer 041 and the second sub-layer 042 comprises specifically also the first lyophilic layer, the first lyophobic layer, the second lyophilic layer and the second lyophobic layer. Here, the height of the edge of the light-emitting layer 05 participating in luminescence is limited below the first lyophobic layer, so that even luminescence may be achieved.

In the pixel defining layer and display panel provided in examples of this disclosure, the pixel defining layer in the related art is divided into two layers, i.e. the pixel defining layer comprises a first sub-layer and a second sub-layer, and the top surface of the first sub-layer and the top surface of the second sub-layer have lyophobicity. Or in other words, it comprises a first lyophobic layer and a second lyophobic layer. Therefore, when the ink containing the light-emitting layer material is spray coated on the anode by using an ink jet printing process subsequently, since there is the second lyophobic layer, the overflow of the ink may be prevented. Since there is the first lyophobic layer, as the ink droplet gradually dries, it may prevent the ink droplet in the pixel from climbing towards the second lyophilic layer. The height to which the ink droplet climbs is reduced greatly, so that the film thickness of the light-emitting layer formed is relatively even. Further, since there is the second lyophilic layer, the ink droplet may spread evenly in the whole ink-containing space during the ink jet printing. The ink droplet remaining on the side wall of the second lyophilic layer will form residual light-emitting material after drying. However, it is separated physically from the light-emitting layer below the first lyophobic layer. It ensures that the film layer remaining on the side wall of the second sub-layer would not affect the luminescence characteristics of the display panel. Therefore, the display panel provided in examples of this disclosure may solve the problem that the display effect is affected by the uneven film thickness of the light-emitting layer formed due to that the light-emitting layer material is at a high place on the side wall after the ink is dried.

Various materials and manners may be used to form the above-mentioned multilayer structure. For example, the multilayer structure may be formed by stacking the lyophilic material and the lyophobic material one by one by CVD.

In view of choice of the materials, difficulty of the process and the compatibility to the existing production process for pixel defining layer, it is appropriate to obtain a lyophobic layer on a lyophilic layer by subjecting a lyophilic precursor layer to a surface treatment.

In one embodiment of the display panel provided in examples of this disclosure, the materials used to produce the pixel defining layer comprise a fluororesin component, for example, a photoresist comprising a fluororesin. The materials used to produce the pixel defining layer may also comprise a fluorine-free resin, a photoinitiator, a solvent, etc. During the pixel defining layer is subjected to patterning or a treatment, for example, when the pixel defining layer is subjected to exposure, development and baking, a part of fluorine in the fluororesin will move towards the top surface of the material and result in enrichment of fluorine atoms. The range of the thickness of the enrichment zone may be 20 nm or more, for example, up to 100 nm, so that the pixel defining layer has lyophobicity near the top surface and lyophilicity in the other part. That is to say, a location in a thickness up to 100 nm near the top surface of the first sub-layer or the second sub-layer may exhibit lyophobicity, while the other part may exhibit lyophilicity.

The top surfaces of the first sub-layer and of the second sub-layer may have lyophobicity by UV treatment, soft-baking, or the like. In a single patterning process, exposure (e.g. UV irradiation) and soft-baking (e.g. heating) may be performed simultaneously. Therefore, the lyophobization treatment and the single patterning process may be performed simultaneously.

In the display panel provided in examples of this disclosure, the top surface of the first sub-layer has lyophobicity, and the other part of the first sub-layer has lyophilicity. The lyophilic part of the first sub-layer ensures that good spreadability may be achieved in the light-emitting region of the sub-pixel after deposition in the ink jet printing process, so as to form an even film layer. The lyophobic top surface of the first sub-layer may prevent the ink droplet from climbing towards the second sub-layer, to reduce the height to which the ink droplet climbs, so as to form a light-emitting layer having an even film thickness. Meanwhile, it ensures that the residual light-emitting material thereabove would not affect the uniform luminescence. The lyophobic top surface in the second sub-layer may prevent the ink from overflowing in the ink jet printing process.

In a specific embodiment, in the display panel provided in examples of this disclosure, the display panel further comprises the light-emitting layer in the pixel zones between the walls of the pixel defining layer. Further, the top surface of the first sub-layer is higher than the top surface of the light-emitting layer. For example, as shown in FIG. 7, the display panel further comprises the light-emitting layer 05 at the side of the anode 03 away from the base substrate 01. The thickness of the first sub-layer 041 may be set according to the thickness of the luminescence device. Optionally, the thickness of the first sub-layer 041 is larger than the total thickness of the anode 03 and the light-emitting layer 05.

The thicknesses of the first lyophilic layer and the first lyophobic layer are configured to allow the light-emitting layer therein emitting light sufficiently, to allow the thickness of the light-emitting layer on the inner wall of the first lyophilic layer to be substantially the same as that at the center of the pixel, and to allow the residual light-emitting material above the first lyophobic layer being separated physically from the light-emitting layer.

The thicknesses of the second lyophilic layer and the second lyophobic layer are configured to be sufficient to contain enough ink. The thickness of the second lyophobic layer may be similar to the thickness of the lyophobic layer in the bifunctional pixel defining layer in the related art.

The thicknesses of the respective layers may be set according to practical requirements and specific conditions.

In a specific embodiment, the light-emitting layer in the display panel provided in examples of this disclosure may comprises sequentially film layers, such as a hole inject layer (HIL), a hole transport layer (HTL), a light-emitting layer (RGB), an electron transport layer (ETL) and an electron inject layer (EIL). It may also be another available configuration in the related art.

Optionally, in a specific embodiment, in the display panel provided in examples of this disclosure, the top surface of the first sub-layer may be higher than the top surface of the light-emitting layer by at least 50 nm. For example, in FIG. 7, the thickness of the first sub-layer is larger than the total thickness of the anode and the light-emitting layer by at least 50 nm. For example, if the thickness of the first sub-layer is 200 nm, the total thickness of the anode and the light-emitting layer should be smaller than or equal to 150 nm.

In a specific embodiment, in the display panel provided in examples of this disclosure, the light-emitting layer is provided on the anode by means of ink jet printing.

Specifically, in the display panel provided in examples of this disclosure, the light-emitting layer comprises at least a red light-emitting layer, a green light-emitting layer and a blue light-emitting layer. Further, it may comprise a white light-emitting layer. It is determined by the specific arrangement manner of the pixels and is not limited herein.

In a specific embodiment, in the display panel provided in examples of this disclosure, the thickness of the first sub-layer may be 150 to 250 nm. The advantage of this range is that an enough and even light-emitting layer may be formed. However, the thickness is not limited herein.

In a specific embodiment, in the display panel provided in examples of this disclosure, the thickness of the second sub-layer may be 850 to 1250 nm. The advantage of this range is that an enough ink-containing space may be formed. However, the thickness is not limited herein.

In a specific embodiment, in the display panel provided in examples of this disclosure, the material of the anode includes transparent conductive material or translucent conductive material.

In a specific embodiment, in the display panel provided in examples of this disclosure, the OLED device is bottom-emitting or top-emitting. A device configuration of the bottom-emitting type is formed by providing a transparent anode and a reflective cathode. In contrast, a device configuration of the top-emitting type is formed by providing a transparent cathode and a reflective anode. Therefore, according to different structures of the device, the anode material is different. It is a transparent or translucent material having a high work function, such as ITO, Ag, NiO, Al, graphene, or the like.

Figure 8:
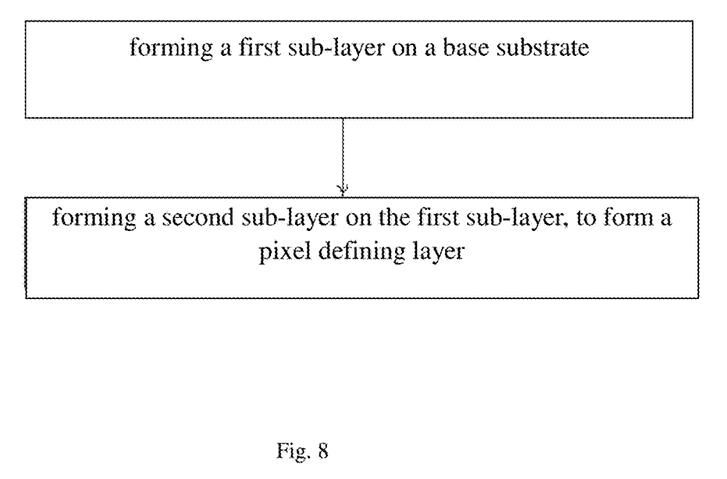
FIG. 8 is a schematic flow chart of a production method of a display panel provided in an example of this disclosure.

On the basis of the same inventive concept, an example of this disclosure further provides a production method of a pixel defining layer. As shown in FIG. 8, the method comprises: forming a first sub-layer on a base substrate; and forming a second sub-layer on the first sub-layer, to form the pixel defining layer.

Specifically, forming a first sub-layer on a base substrate may comprise: forming a first lyophilic precursor layer on the base substrate; and subjecting the top surface of the first lyophilic precursor layer to a lyophobization treatment, to form the first sub-layer.

Specifically, forming a second sub-layer on the first sub-layer may comprise: forming a second lyophilic precursor layer on the first sub-layer; and subjecting the top surface of the second lyophilic precursor layer to a lyophobization treatment, to form the second sub-layer.

The first or second lyophilic precursor layer may comprise a fluororesin, and the lyophobization treatment may be an exposure treatment and/or soft-baking. Specifically, the lyophobization treatment may be performed with a single patterning process simultaneously.

Figure 9A:
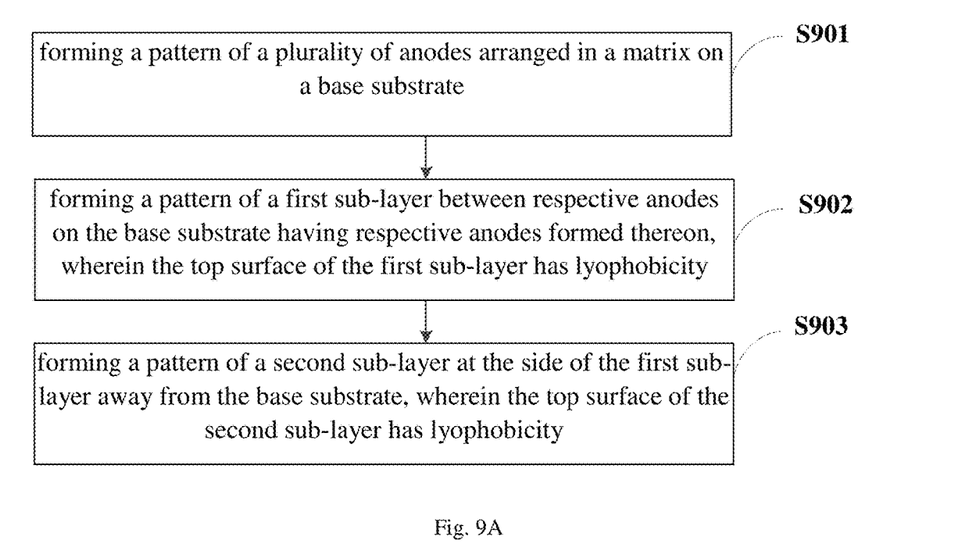
FIGS. 9A to 9C are schematic flow charts of a production method of a display panel provided in another example of this disclosure.

An embodiment thereof is shown in FIG. 9A. The method comprises the following steps:

S901. Forming a pattern of a plurality of anodes arranged in a matrix on a base substrate;

S902. Forming a pattern of a first sub-layer between respective anodes on the base substrate having respective anodes formed thereon, wherein the top surface of the first sub-layer has lyophobicity;

S903. Forming a pattern of a second sub-layer at the side of the first sub-layer away from the base substrate, wherein the top surface of the second sub-layer has lyophobicity.

In the pixel defining layer and display panel provided in examples of this disclosure, the pixel defining layer in the related art is divided into two layers, i.e. the pixel defining layer comprises a first sub-layer and a second sub-layer, and the top surface of the first sub-layer and the top surface of the second sub-layer have lyophobicity. Or in other words, it comprises a first lyophobic layer and a second lyophobic layer. Therefore, when the ink containing the light-emitting layer material is spray coated on the anode by using an ink jet printing process subsequently, since there is the second lyophobic layer, the overflow of the ink may be prevented. Since there is the first lyophobic layer, as the ink droplet gradually dries, it may prevent the ink droplet in the pixel from climbing towards the second lyophilic layer. The height to which the ink droplet climbs is reduced greatly, so that the film thickness of the light-emitting layer formed is relatively even. Further, since there is the second lyophilic layer, the ink droplet may spread evenly in the whole ink-containing space during the ink jet printing. The ink droplet remaining on the side wall of the second lyophilic layer will form residual light-emitting material after drying. However, it is separated physically from the light-emitting layer below the first lyophobic layer. This ensures that the film layer remaining on the side wall of the second sub-layer would not affect the luminescence characteristics of the display panel.

Figure 9B:
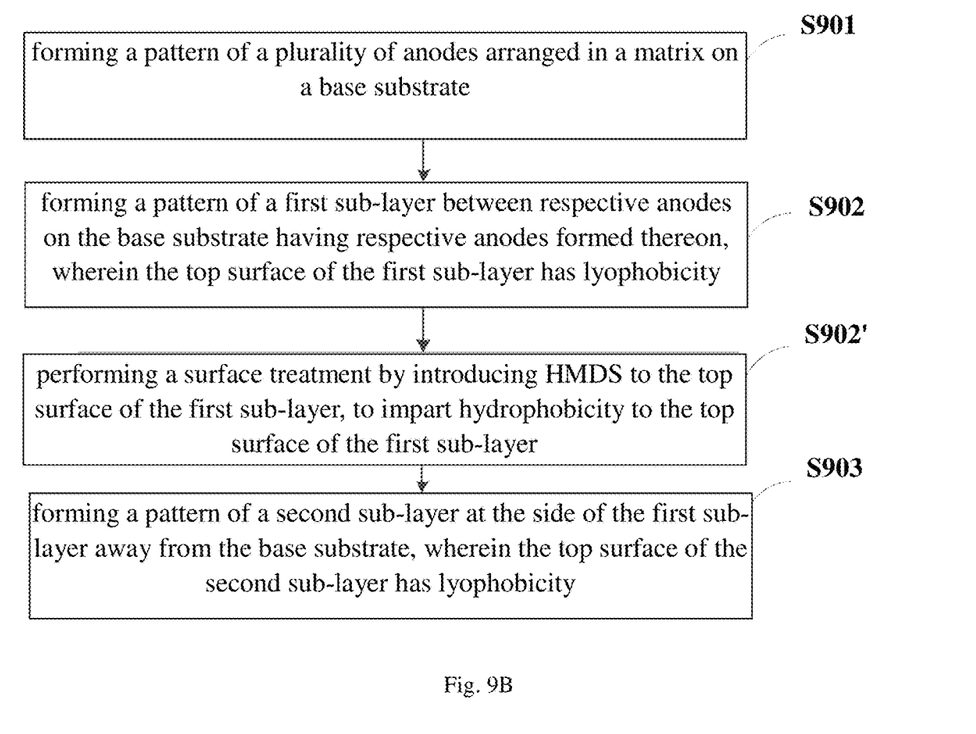

In an specific embodiment, as shown in FIG. 9B, the production method of the pixel defining layer provided in examples of this disclosure, after forming a pattern of a first sub-layer between respective anodes on the base substrate having respective anodes formed thereon and before forming a pattern of a second sub-layer at the side of the first sub-layer away from the base substrate, further comprises:

S902'. Performing a surface treatment by introducing hexamethyldisilazane (HMDS) to the top surface of the first sub-layer, to impart hydrophobicity to the top surface of the first sub-layer. It is not easy to form a second lyophilic precursor layer directly on the first lyophobic layer. Performing a surface treatment by using HMDS may make the formation of the second lyophilic precursor layer become easier. In a specific embodiment, the HMDS process is performed at the top surface of the first sub-layer, and then etching of HMDS is carried out by a dry etching process, to remove the HMDS in the pixel zone. This allows the second sub-layer formed subsequently to have a relatively high adhesion to the first sub-layer, while the luminescence in the pixel zone is not affected. The specific HMDS process is the same as that in the related art and is not described in details herein.

Figure 9C:
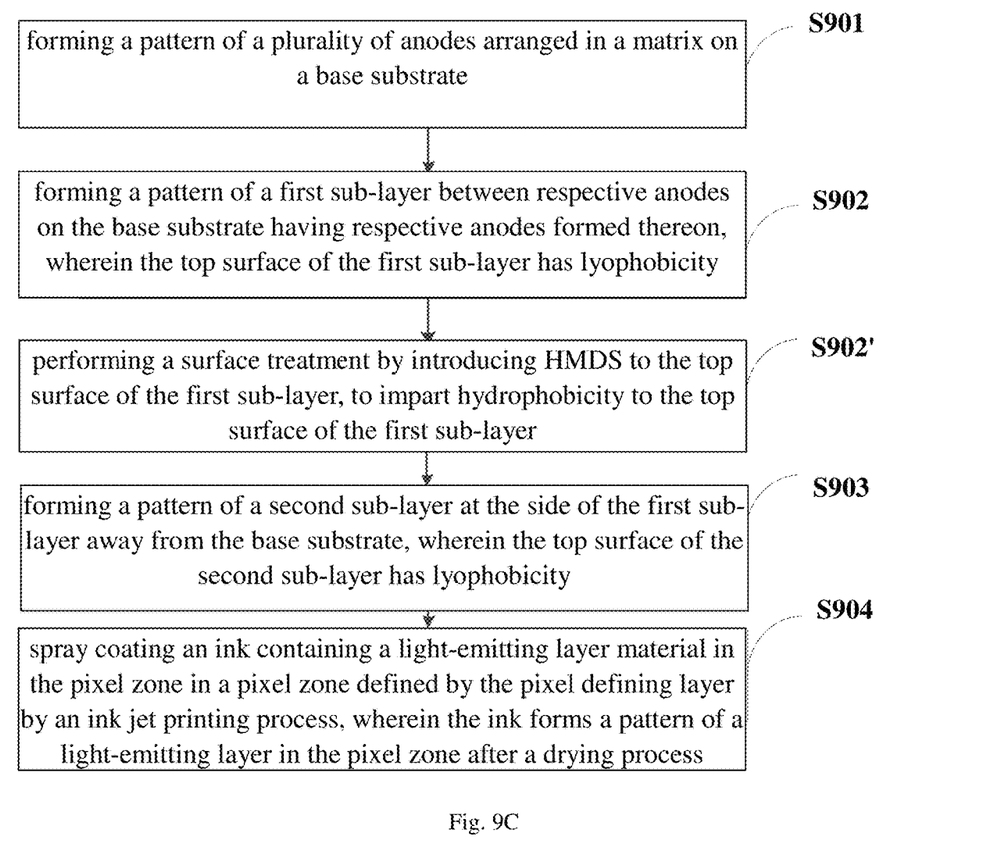

In a specific embodiment, as shown in FIG. 9C, the production method of the display panel comprising the pixel defining layer provided in examples of this disclosure, after forming a pattern of a second sub-layer at the side of the first sub-layer away from the base substrate, further comprises:

S904. Spray coating an ink containing a light-emitting layer material in the pixel zone in a pixel zone defined by the pixel defining layer by an ink jet printing process, wherein the ink forms a pattern of a light-emitting layer in the pixel zone after a drying process.

Figure 10:
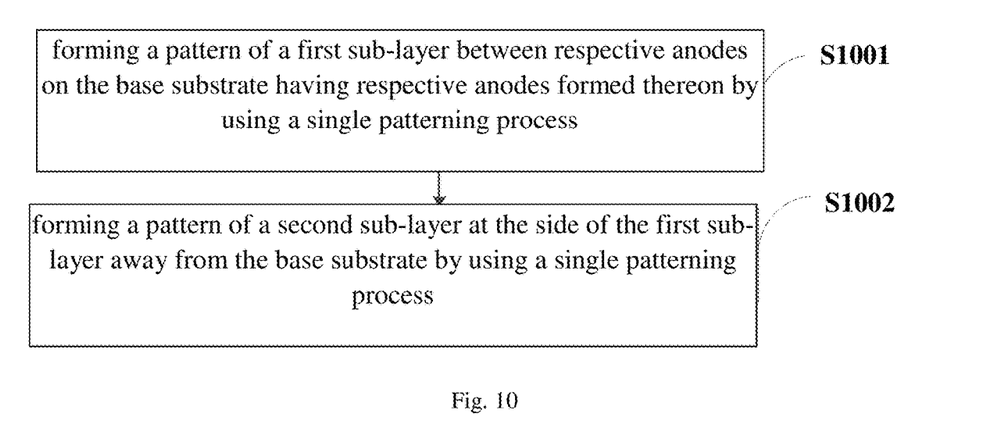
FIG. 10 is a schematic flow chart of a production method of a display panel provided in another example of this disclosure.

In a specific embodiment, as shown in FIG. 10, in the production method of the display panel provided in examples of this disclosure, forming a pattern of a first sub-layer between respective anodes on the base substrate having respective anodes formed thereon and forming a pattern of a second sub-layer at the side of the first sub-layer away from the base substrate specifically comprise:

S1001. Forming a pattern of the first sub-layer between respective anodes on the base substrate having respective anodes formed thereon by using a single patterning process, which may simplify the process and save the production costs; and S1002. Forming a pattern of a second sub-layer at the side of the first sub-layer away from the base substrate by using a single patterning process, which may simplify the process and save the production costs.

It should be explained that in the production method of the display panel provided in examples of this disclosure, the patterning process may comprise photoetching technology only, or, may comprise photoetching technology and etching step, and may comprise other technologies for forming a predetermined pattern, such as printing, ink jet, etc. The photoetching technology refers to a technology, which includes processes, such as film formation, exposure, development, and the like, for forming a pattern by using a photo resist, a mask, an exposure machine, or the like. In an embodiment, a suitable patterning process may be selected according to the structure formed in this disclosure.

Figure 11A:
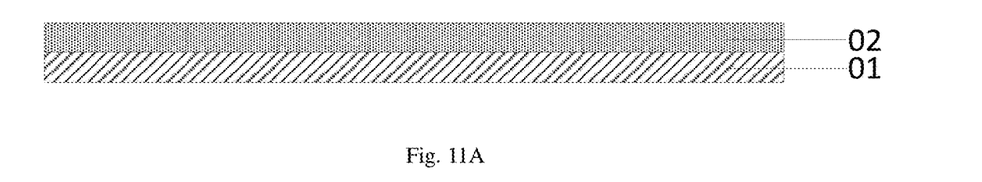
FIGS. 11A to 11F are schematic drawings of the structures of a display panel provided in an example of this disclosure after respective steps are carried out.
Figure 11B:
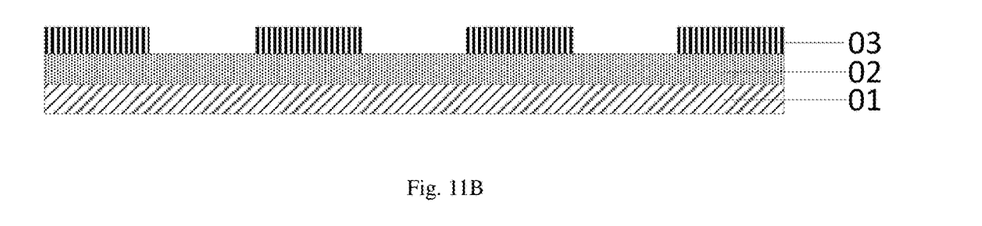
Figure 11C:
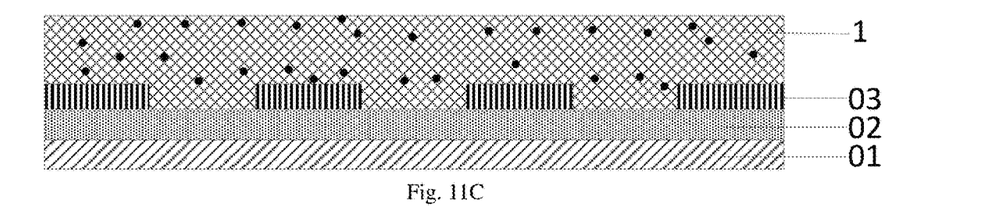
Figure 11D:
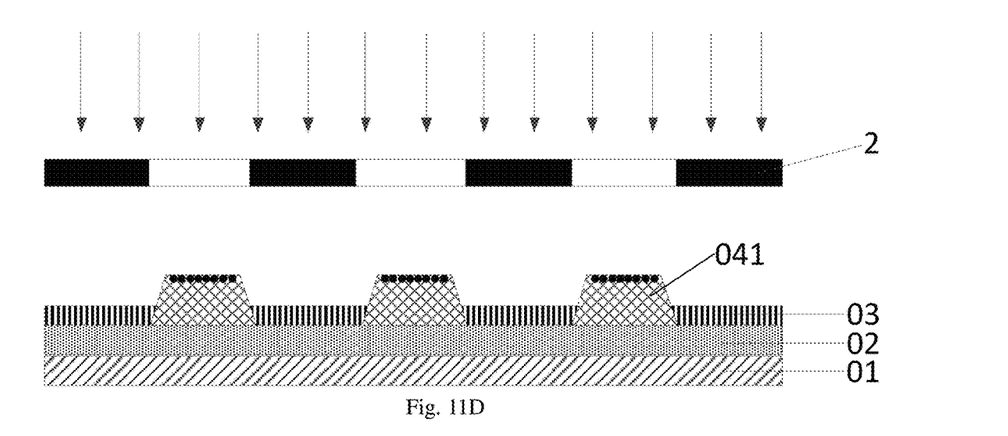
Figure 11E:
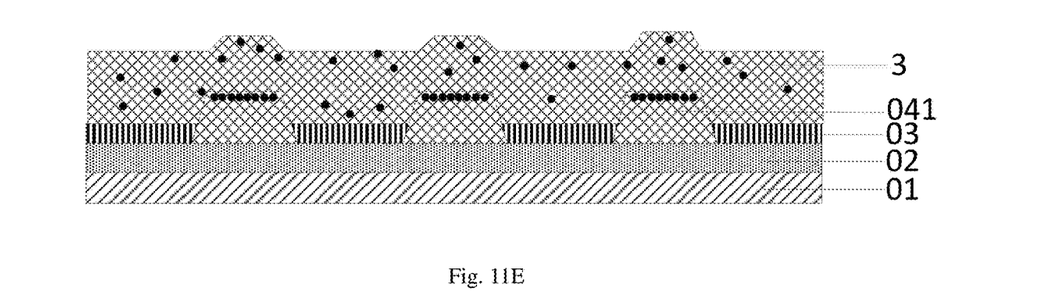
Figure 11F:
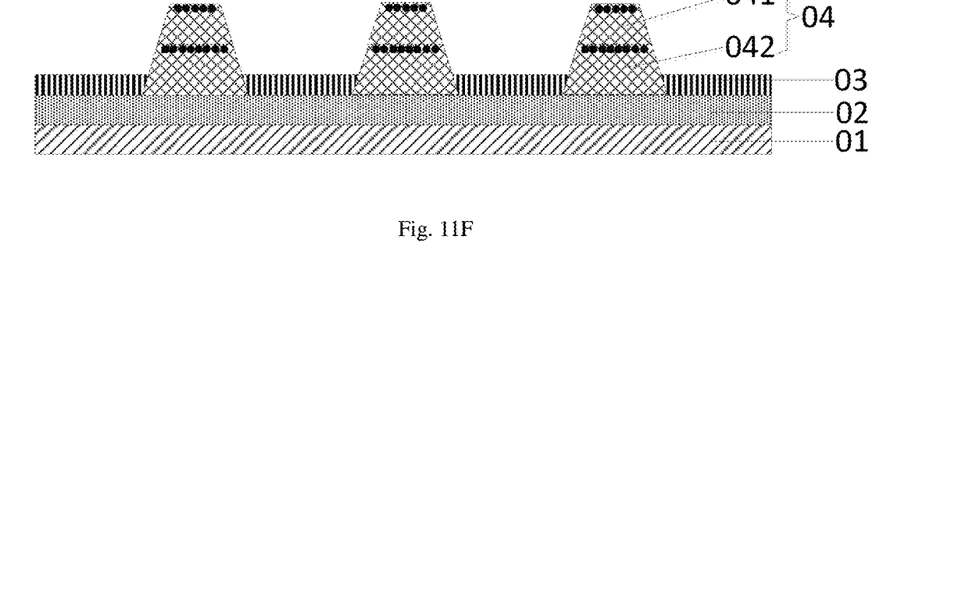

A production method for a display panel provided in an example of this disclosure is illustrated by an example, as shown in FIGS. 11A to 11F and FIG. 7. Specifically, the production method comprises the following steps:

Forming a buffer layer 02 on a base substrate 01, as shown in FIG. 11A;

Forming a pattern of a plurality of anodes 03 arranged in a matrix on the base substrate 01 having the buffer layer 02 formed thereon, as shown in FIG. 11B;

Forming a first photoresist thin film 1 on the base substrate 01 having respective anodes 03 thereon, as shown in FIG. 11C;

Performing exposure, development and baking to the first photoresist thin film 1 by a first mask 2, to form a first sub-layer 041 between respective anodes 03, wherein the top surface of the first sub-layer 041 has lyophobicity, and the other part thereof has lyophilicity, as shown in FIG. 11D;

Introducing hexamethyldisilazane at the top surface of the first sub-layer 041 to perform a surface treatment, to impart hydrophobicity to the top surface of the first sub-layer 041, so as to allow the second sub-layer formed subsequently to have a relatively high adhesion to the first sub-layer;

Forming a second photoresist thin film 3 on the base substrate 01 having the first sub-layer 041 formed thereon, as shown in FIG. 11E;

Performing exposure, development and baking to the second photoresist thin film 3 by a second mask 4, to form a second sub-layer 042 at the side of the first sub-layer 041 away from the base substrate 01 by using a single patterning process, wherein the top surface of the second sub-layer 042 has lyophobicity, and the other part thereof has lyophilicity, as shown in FIG. 11F; and Spray coating an ink containing a light-emitting layer material on the anode 03 by an ink jet printing process, wherein the ink forms a pattern of a light-emitting layer 05 at the side of the anode 03 away from the base substrate 01 after a drying process, as shown in FIG. 7.

A display panel provided in an example of this disclosure may be obtained by the above-mentioned steps (1) to (8).

It should be explained that in the production method for the display panel provided in the example of this disclosure, exposing the first photoresist thin film and exposing the second photoresist thin film in FIG. 11D and FIG. 11F are carried out by the manner for a negative photoresist. However, in an embodiment, the first photoresist thin film and the second photoresist thin film may also be exposed by the manner for a positive photoresist. The specific exposure manner may be selected according to practical conditions and is not limited herein.

On the basis of the same inventive concept, an example of this disclosure further provides a display apparatus comprising the display panel in the above-mentioned examples. Since the display apparatus has the same principle for solving problems as that of the display panel mentioned above, the embodiment of the display apparatus may refer to the embodiments of the display panel mentioned above. The same description is not repeated again.

In a specific embodiment, the display apparatus provided in examples of this disclosure may be a full screen display apparatus, a flexible display apparatus, or the like. It is not limited herein.

In a specific embodiment, the display apparatus provided in examples of this disclosure may be a full screen mobile phone. It is apparent that the display apparatus provided in examples of this disclosure may also be any product or component having the function of display, such as a tablet PC, a TV, a display, a laptop, a digital frame, a navigator, or the like. The other constituent parts necessary for the display apparatus should also be present, as understood by a person skilled in the art. They are not described in details herein and should not be a limitation to this disclosure.

Examples of this disclosure provide a display panel, a production method thereof and a display apparatus. The display panel comprises a base substrate, a plurality of anodes arranged in a matrix on the base substrate, and a pixel defining layer located between respective anodes, wherein the pixel defining layer comprises a first sub-layer located at the side towards the base substrate and a second sub-layer located at the side of the sub-layer away from the base substrate, wherein the top surface of the first sub-layer and the top surface of the second sub-layer have lyophobicity. The pixel defining layer in the related art is divided into two layers, i.e. the pixel defining layer comprises a first sub-layer and a second sub-layer, and the top surface of the first sub-layer and the top surface of the second sub-layer have lyophobicity. Or in other words, it comprises a first lyophobic layer and a second lyophobic layer. Therefore, when the ink containing the light-emitting layer material is spray coated on the anode by using an ink jet printing process subsequently, since there is the second lyophobic layer, the overflow of the ink may be prevented. Since there is the first lyophobic layer, as the ink droplet gradually dries, it may prevent the ink droplet in the pixel from climbing towards the second lyophilic layer. The height to which the ink droplet climbs is reduced greatly, so that the film thickness of the light-emitting layer formed is relatively even. Further, since there is the second lyophilic layer, the ink droplet may spread evenly in the whole ink-containing space during the ink jet printing. The ink droplet remaining on the side wall of the second lyophilic layer will form residual light-emitting material after drying. However, it is separated physically from the light-emitting layer below the first lyophobic layer. It ensures that the film layer remaining on the side wall of the second sub-layer would not affect the luminescence characteristics of the display panel. Therefore, the display panel provided in examples of this disclosure may solve the problem that the display effect is affected by the uneven film thickness of the light-emitting layer formed due to that the light-emitting layer material is at a high place on the side wall after the ink is dried.

It is apparent that a person skilled in the art may perform various changes and modifications to the Examples of this disclosure without departing from the spirit and scope of this disclosure. Thus, when these changes and modifications pertain to the scope of the claims and equivalent technology thereof in this disclosure, it is intended that these changes and modifications are included in this disclosure.

The invention claimed is:

1. A display panel, comprising
a base substrate,
a pixel defining layer on the base substrate, wherein the pixel defining layer defines a pixel zone, and comprises:
 a first lyophilic layer;
 a first lyophobic layer on the first lyophilic layer;
 a second lyophilic layer on the first lyophobic layer; and
 a second lyophobic layer on the second lyophilic layer; and
a light-emitting layer in the pixel zone, wherein the top surface of the first lyophobic layer is higher than the top surface of the light-emitting layer,
wherein the top surface of the first lyophobic layer is higher than the top surface of the light-emitting layer by at least 50 nm.

2. A display apparatus, comprising the display panel of claim 1.

3. A production method for a pixel defining layer, comprising:
forming a first lyophilic layer;
forming a first lyophobic layer on the first lyophilic layer;
forming a second lyophilic layer on the first lyophobic layer; and
forming a second lyophobic layer on the second lyophilic layer, to form the pixel defining layer,
wherein forming the first lyophilic layer and forming the first lyophobic layer on the first lyophilic layer comprises:
 forming a first lyophilic precursor layer; and
 subjecting the top surface of the first lyophilic precursor layer to a lyophobization treatment, to form the first lyophilic layer and the first lyophobic layer thereon.

4. The production method of claim 3, wherein the first lyophilic precursor layer comprises a fluororesin, and the lyophobization treatment includes an exposure treatment and/or soft-baking.

5. The production method of claim 3, wherein forming the second lyophilic layer and the second lyophobic layer thereon on the first lyophobic layer comprises
forming a second lyophilic precursor layer on the first lyophobic layer; and
subjecting the top surface of the second lyophilic precursor layer to a lyophobization treatment, to form the second lyophilic layer and the second lyophobic layer thereon.

6. The production method of claim 5, wherein the second lyophilic precursor layer comprises a fluororesin, and the lyophobization treatment includes an exposure treatment and/or soft-baking.

7. The production method of claim 3, wherein before forming the second lyophilic layer and forming the second lyophobic layer on the second lyophilic layer, the production method further comprises
performing a surface treatment by introducing hexamethyldisilazane to the top surface of the first lyophobic layer, to impart hydrophobicity to the top surface of the first lyophobic layer.

8. The production method of claim 3, wherein the first lyophilic layer and the first lyophobic layer thereon are formed by a single patterning process, and the second lyophilic layer and the second lyophobic layer thereon are formed by a single patterning process, wherein the single patterning processes comprise an exposure treatment and soft-baking.

9. A production method for a display panel, comprising
forming a pixel defining layer, which defines a pixel zone, by the production method of claim 3; and
spray coating an ink containing a light-emitting layer material in the pixel zone by an ink jet printing process, wherein the ink forms a light-emitting layer in the pixel zone after a drying process.

* * * * *